United States Patent [19]

Calabro et al.

[11] Patent Number: 4,481,525
[45] Date of Patent: Nov. 6, 1984

[54] HEAT DISSIPATOR FOR INTEGRATED CIRCUIT CHIPS

[75] Inventors: Anthony D. Calabro, 8738 West Chester Pike, Upper Darby, Pa. 19082; Richard J. Marchetti, Norristown, Pa.

[73] Assignee: Anthony D. Calabro, W. Chester, Pa.

[21] Appl. No.: 407,348

[22] Filed: Aug. 12, 1982

[51] Int. Cl.³ .................. H01L 23/36; H01L 23/40; H01L 23/04
[52] U.S. Cl. ........................ 357/81; 357/79; 357/74; 174/16 HS
[58] Field of Search ............... 357/81, 79; 174/16 HS

[56] References Cited

FOREIGN PATENT DOCUMENTS 1316086  5/1973  United Kingdom ............ 357/81 C
1334173 10/1973  United Kingdom ............ 357/81 C
2088128  6/1982  United Kingdom ................ 357/81

OTHER PUBLICATIONS

"Variable-Area Heat Sink Device"-Connors-IBM Technical Disclosure Bulletin, vol. 17, No. 4, Sep. 1974, p. 1016.

Primary Examiner—Andrew J. James
Assistant Examiner—S. V. Clark
Attorney, Agent, or Firm—Anthony J. Casella; Gerald E. Hespos

[57] ABSTRACT

A heat dissipator is provided including a radiator chimney and a separate heat conducting clamp for use with integrated circuit chips. The radiator chimney functions to conduct heat away from the top surface of the chip, and to radiate the heat upwardly into the air. The heat conducting clamp functions to conduct heat away from the bottom surface of the chip to the radiator chimney and also to securely retain both members of the heat dissipator in contact with the chip. The biasing clamping engagement between the radiator chimney and the heat conducting clamp enables easy mounting of the subject heat dissipator, as well as removal and reuse.

13 Claims, 8 Drawing Figures

HEAT DISSIPATOR FOR INTEGRATED CIRCUIT CHIPS

BACKGROUND OF THE INVENTION

Integrated circuit (IC) chips, such as microprocessors or micro-computers have enabled a dramatic reduction in the space requirements for electronic circuitry. The typical IC chip is a rectangular structure, having an outer portion formed from an insulating material Embedded centrally within insulating material is a small, but complicated, array of circuitry such as the microprocessor or micro-computer. Electrically conductive leads, also embedded in the insulating material extend from the microprocessor to downwardly extending pins that typically are mounted on opposed side edges of the chip. The pins provide the connection between the microprocessor and other components of the device in which the chip is used. In most instances, this connection is made by mounting the chip on a printed circuit board having conductive leads extending to other electrical components of the device.

The flow of electricity generates heat directly proportional to the amount of electric current and inversely proportional to the size of the electrically conductive area. Since the microprocessor, micro-computer or other complex circuitry of the IC chip accommodates a relatively large amount of electrical current flow within an extremely small area, the chips generate a substantial amount of heat. This heat can affect the efficiency and operability of the IC chip, and thus of the entire device within which the chip is used. The effect of the heat generated by IC chips is exacerbated by the close spacing of chips and other components on printed circuit boards, and the close spacing of printed circuit boards within electrical devices.

Heat dissipators or heat sinks are used to offset the heat generated by IC chips. The heat dissipators or sinks conduct heat away from the chip, thereby maintaining the operating temperature of the chip at an acceptable level. The heat conducted from the chip then is radiated to the surrounding air and dissipated by convection. Heat dissipators generally are utilized in conjunction with all but the smallest integrated circuit chips, and are virtually mandatory in the larger chips housing microprocessors or micro-computers which have a vast amount of circuitry in a small area.

The most commonly used prior art heat dissipator consists of a unitary member of heat conductive material that is adhesively mounted to the top surface of the chip. These prior art dissipators, although functional, have disadvantages. One disadvantage relates to the structure of the chip itself. Specifically, the circuitry in the chip is located such that most of the generated heat is directed through the bottom surface of the chip. For example, it is estimated that in the typical IC chip between 60% and 66% of the heat generated by the chip passes through its bottom surface. As a result, the single member heat dissipator adhesively mounted on the top of the chip is able to conductively dissipate only a small part of the heat generated by the chip. Thus, the single member prior art heat dissipator described above has only limited effectiveness for dissipating the heat generated by IC chips. Another disadvantage is that the adhesive attachment of the dissipator to the chip precludes reuse of the dissipator when a chip is replaced. Additionally, the adhesives add to the time and cost of manufacture.

Other prior art heat dissipators have been developed which consist of separate top and bottom members to contact respectively the top and bottom surfaces of the chip. By providing direct contact to both opposed surfaces of the chip, these two member heat dissipators more efficiently reduce operating temperatures.

Prior art two member heat dissipators have been developed in many structural forms. For example, in certain prior art heat dissipators, both the top and bottom members are adhesively affixed to the respective top and bottom surfaces of the chip. Although this arrangement dissipates heat, it has several disadvantages. Specifically, the adhesive attachment of the dissipator to the chip adds to the time and cost required to assemble the electrical apparatus. Additionally, the adhesive attachments of the dissipator to the chips are permanent. Consequently, new top and bottom members of the dissipator must be provided if the chip is changed.

Two member heat dissipators have been developed which rely on screws, bolts, rivets or other separate mechanical connectors instead of the adhesives described above. The members of these prior art dissipators can be affixed mechanically to either one another or to adjacent portions of the printed circuit board. Although these dissipators can be reused, the connecting structures add substantially to the cost associated with manufacture and assembly.

In many prior art two member heat dissipators, the bottom member contributes only minimally to the heat dissipation function. For example, bottom members often are small and narrow providing for little conduction or radiation of heat away from the IC chip. In other prior art two member heat dissipators, attempts are made to enhance the radiation from the chip by providing a plurality of outwardly extending vanes or fins on the top member. These fins typically extend well beyond the plan dimension of the chip, thereby increasing the space requirements within the electrical device.

In still another prior art two member heat dissipator, as shown in U.S. Pat. No. 4,235,285, a pair of inwardly and outwardly rolled clasp members are used to interengage the top and bottom members. The dissipator shown in U.S. Pat. No. 4,235,285 also has several disadvantages. First, vibrations in the electrical device can cause the bottom member to move relative to the top member and the chip, thereby creating the risk of contact with the pins and a resultant short circuiting. Second, the dissipator taught by U.S. Pat. No. 4,235,285 extends substantially beyond the plan dimensions of the chip in order to attain the proper heat dissipation. Specifically, the alternate embodiments shown in U.S. Pat. No. 4,235,285 either include outwardly extending radiating fins or large looping clasps that perform both a connecting and a heat radiating function. These added space requirements of the heat dissipator often control the overall size of the electrical device in which it is used. Third, the various embodiments shown in U.S. Pat. No. 4,235,285 do not effectively enable the conduction and then radiation of heat upward and away from the bottom surface of the IC chip. More particularly, the heat either is radiated initially through conducting planes that are substantially parallel to the planes of the chip and the circuit board, or the heat from the bottom surface must be radiated through the top contact plate to reach the fins. Thus, these embodiments do not directly radiate the substantial heat generated by the bottom surface of the chip upward and away from the chip and the circuit board. Fourth, the rolled clasp connection between the top and bottom members provides for poor heat conduction between those two members. As a result the effectiveness of the top member in radiating heat generated from the bottom surface is reduced. Fifth, the devices require awkward and difficult manipulation to be effectively mounted. Finally, the complex arrangement of rolled clasps and interengaging loops contributes to the manufacturing cost.

Accordingly, it is an object of the subject invention to provide a heat dissipator for use with IC chips that effectively dissipates heat from both the top and bottom surfaces of the chip.

It is another object of the subject invention to provide a heat dissipator for use with IC chips that does not require adhesive mounting on the chip.

It is a further object of the subject invention to provide a heat dissipator for use with integrated circuit chips that does not require ancillary mounting devices.

It is still another object of the subject invention to provide a heat dissipator for use with IC chips that can be easily mounted on the chip.

It is still a further object of the subject invention to provide a heat dissipator for use with IC chips that can be easily removed from the chip and subsequently reused.

It is still an additional object of the subject invention to provide a heat dissipator for use with IC chips that does not extend beyond the plan dimensions of the chips.

It is yet another object of the subject invention to provide a heat dissipator for use with IC chips that can be securely mounted on the chips thereby avoiding potential shorting against the electrically conductive members of the chip.

SUMMARY OF THE INVENTION

The subject heat dissipator includes a radiator chimney and a heat conducting clamp. Preferably, the radiator chimney is a substantially rectangular opened-box shaped structure having pairs of opposed side and end walls extending upwardly from the contact plate. The contact plate of the radiator chimney is a rectangular member having dimensions substantially equal to those of the IC chip. A positioning aperture in the contact plate corresponds in location and dimension to the raised grounding plate on the top surface of the chip beneath which the integrated circuitry lies. The positioning aperture positions the radiator chimney on the chip and inhibits relative movement therebetween. The side and end walls of the radiator chimney extend upwardly from the contact plate thereof at substantially right angles. The height of the end walls is less than the height of the side walls thereof to facilitate mounting of the clamp as explained below. A plurality of air flow apertures extend through the side walls of the radiator chimney to facilitate air flow into and upwardly through the subject dissipator thereby creating the chimney effect and aiding in heat dissipation.

The heat conducting clamp preferably is formed from a unitary strip of resilient heat conductive material having a width slightly less than the width of the integrated circuit chip. The heat conducting clamp is formed into a symmetrical U-shaped structure having a bottom contact plate, opposed upstanding end arms and inwardly directed clamping flanges attached to the tops of the opposed end walls. The bottom contact plate and end arms of the heat conducting clamp are separated from one another by approximately 85°. The top surface of the bottom contact plate of the heat conducting clamp is placed into contact with the bottom surface of the IC chip. Specifically, the end arms are rotated away from one another enabling the heat conducting clamp to move upward into contact with a radiator chimney and the chip. More specifically, the dimensions of the end arms are selected to ensure that when the bottom contact plate of the heat conducting clamp contacts the bottom surface of the chip, the clamping flanges will be in a position to snap into engagement with the respective upper ends of the radiator chimney end walls.

The structure of the subject invention readily enables heat to be dissipated directly upwardly and away from the top and bottom surfaces of the chip through the radiator chimney and the heat conducting clamp. This efficient heat dissipation is due in part to the heat conducting clamping engagement between the two members as well as the chimney effect, both of which are described further below. Additionally, the cooperation between the radiator chimney and the heat conducting clamp, as well as the cooperation between the rectangular aperture in the top contact plate and the grounding plate above the circuitry of the chip, ensures that the heat dissipator will be securely mounted on the chip. This structure provides for efficient heat dissipation as well as easy low cost mounting of the heat dissipator on the chip and the ability for frequent reuse. Furthermore, the structure achieves these functions without adding significantly to the plan dimensions of the chip.

DETAILED DESCRIPTION OF THE PREFERRED EMBODIMENT

Figure 1:
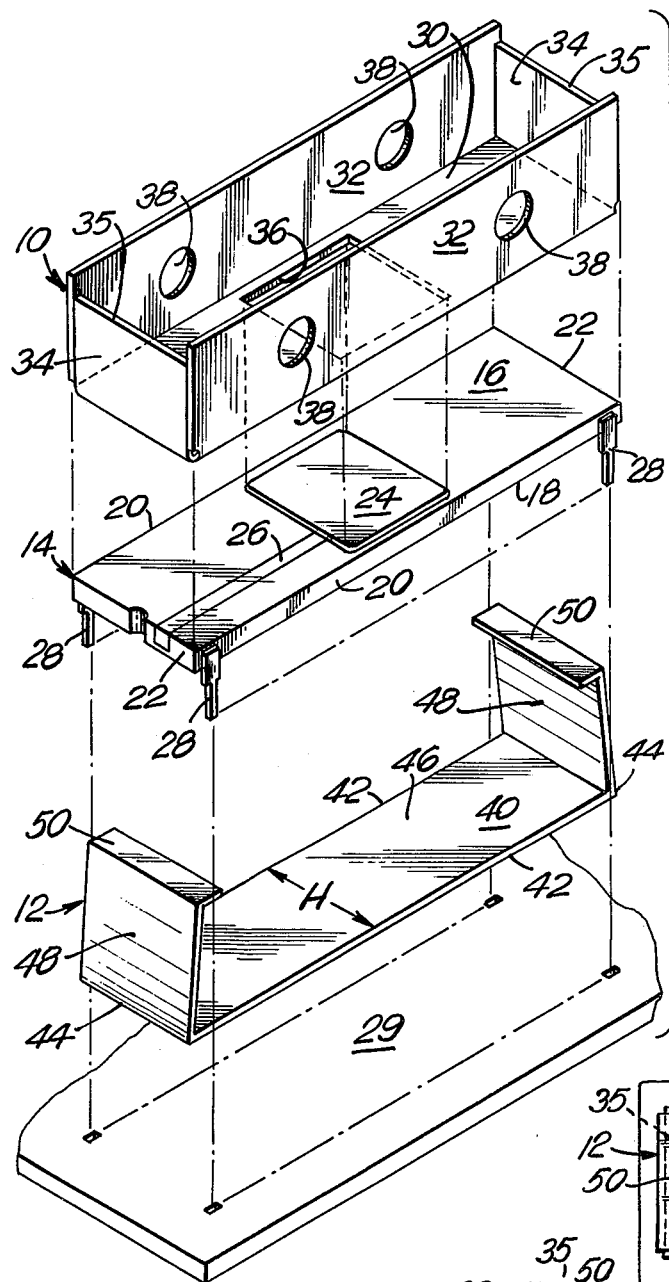
FIG. 1 is an exploded perspective view of the subject heat dissipator shown with an integrated circuit chip and a printed circuit board.

The heat dissipator of the subject invention includes a radiator chimney 10 and a heat conducting clamp 12 as shown in FIG. 1. Radiator chimney 10 and heat conducting clamp 12 are used to dissipate heat generated by integrated circuit (IC) chip 14. IC chip 14 typically houses a micro-computer or a microprocessor. Specifically, IC chip 14 includes a top surface 16, a bottom surface 18, a pair of opposed side edges 20 and a pair of opposed end edges 22. A substantially square grounding plate 24 extends upwardly out of the top surface 16 of IC chip 14. A complex array of circuitry such as a microcomputer or a microprocessor is disposed within the body of IC chip 14 directly beneath grounding plate 24.

Grounding lead 26 extends from grounding plate 24 along top surface 16 and end edge 22 of integrated circuit chip 14.

A plurality of pins 28 are disposed along opposed side edges 20 of integrated circuit chip 14. Pins 28 are electrically connected to the circuitry of integrated circuit chip 14 by electrically conductive leads (not shown) disposed within the body of chip 14. As explained further below, chip 14 typically is mounted on a printed circuit board 29, and pins 28 are electrically connected to other components of the device in which chip 14 is used.

As explained above, the flow of current through IC chip 14 generates a substantial amount of heat, which if not dissipated, can affect the operation of the microprocessor or microcomputer of chip 14. Because the complex circuitry of the chip is disposed centrally therein heat is generated through both top surface 16 and bottom surface 18. More particularly, experience indicates that often between 60% and 66% of the heat generated by the integrated circuit chip 14 will be conducted through bottom surface 18 thereof. To efficiently dissipate the heat from both the top and bottom surfaces 16 and 18 of IC chip 14, the subject heat dissipator provides radiator chimney 10 and heat conducting clamp 12 which mount on chip 14 and connect to one another as shown in FIGS. 1 through 4.

Figure 4:
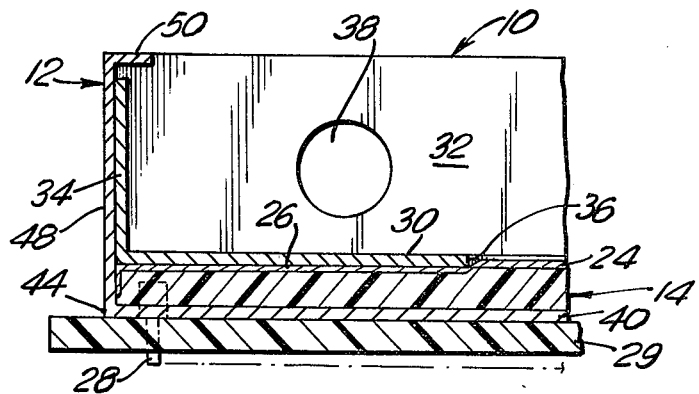
FIG. 4 is a side view taken along line 4—4 in FIG. 2.
Figure 5:
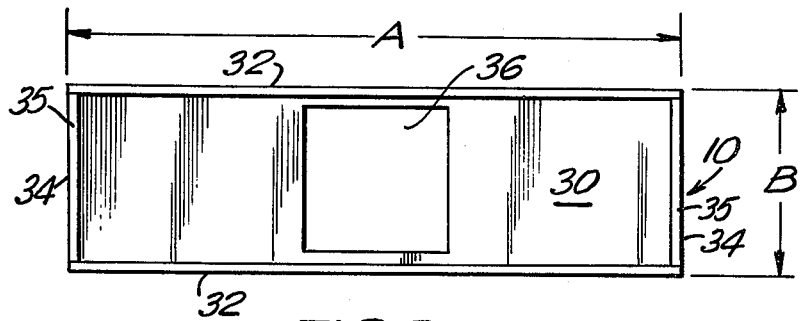
FIG. 5 is a top view of the radiator chimney of the subject heat dissipator.
Figure 6:
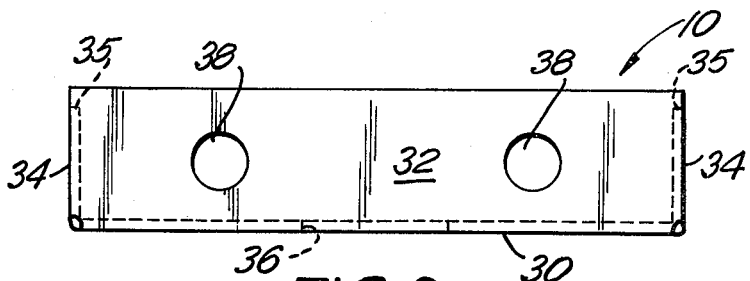
FIG. 6 is a side view of the radiator chimney shown in FIG. 5.
Figure 7:
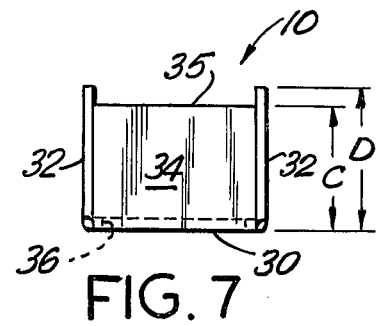
FIG. 7 is an end view of the radiator chimney shown in FIGS. 5 and 6.

Turning to FIGS. 5 through 7, the radiator chimney 10 of the subject heat dissipator is illustrated. Specifically, radiator chimney 10 includes substantially rectangular top contact plate 30, upstanding substantially rectangular opposed side walls 32, and upstanding opposed substantially rectangular end walls 34. Side and end walls 32 and 34 are alternately connected to one another to define a box-shaped chimney structure which causes an upward air flow as explained below. The length and width of top contact plate 30 as indicated by distances A and B respectively in FIG. 5, corresponds to the length and width of the integrated circuit chip 14 with which the subject heat dissipator is used. Thus, when radiator chimney 10 is mounted on top surface 16 of chip 14, as shown in FIGS. 1 through 4, top contact plate 30 and top surface 16 will be in contact with one another across substantially their entire dimensions.

As shown most clearly in FIG. 5, top contact plate 30 of radiator chimney 10 is provided with a centrally located substantially square aperture 36, the dimensions of which are equal to the dimensions of grounding plate 24 on chip 14. As explained further below, radiator chimney 10 is mounted on top surface 16 of chip 14 such that aperture 36 engages grounding plate 24. This cooperation between grounding plate 24 and aperture 36 functions to properly position radiator chimney 10 on chip 14 and to inhibit slidable movement therebetween.

Turning to FIG. 6, side walls 32 of radiator chimney 10 each are provided with a pair of air flow apertures 38. Preferably, airflow apertures 38 are round holes of approximately ¼ inch diameter. Airflow apertures 38 function to allow air within an electrical device to flow into radiator chimney 10 and upwardly therefrom to provide the desired chimney effect which enables efficient heat dissipation without extending the subject heat dissipator beyond the plan dimensions of the chip 14. This airflow may be caused by the natural movements of air resulting from temperature variations, or may be forced by mechanical means.

As shown most clearly in FIG. 7, the height of end walls 34, as indicated by distance "C" is less than the height of side walls 32, as indicated by distance "D". Preferably, the difference in distances "C" and "D" is substantially equal to the thickness of the material from which heat conducting clamp 12 is formed to enable a secure clamping as explained below.

Figure 8:
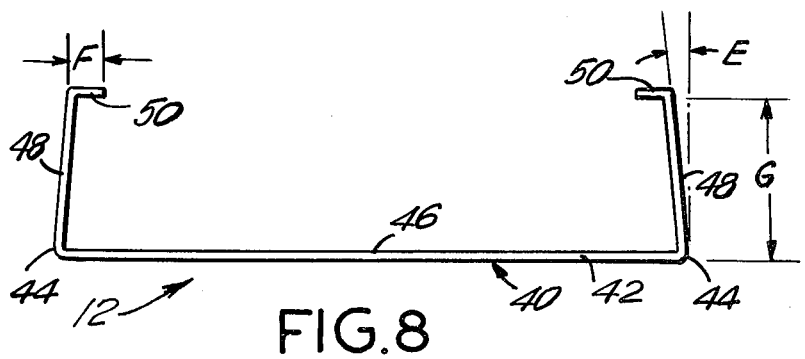
FIG. 8 is a side view of the heat conducting clamp of the subject invention.

Referring to FIG. 8, heat conducting clamp 12 is a symmetrical U-shaped structure preferably formed from an anodized aluminum or phosphorous bronze material having a thickness of 0.020 inches. The base of the U-shaped heat conducting clamp 12 is defined by a substantially planar and rectangular bottom contact plate 40 which has opposed side edges 42 and opposed end edges 44, and which includes upper surface 46. The U-shape is further defined by substantially rectangular end arms 48 which extend upwardly from opposed end edges 44 of bottom contact plate 40. More particularly, end arms 48 are disposed with respect to bottom wall 40 at an angle indicated by "E" in FIG. 8 which is approximately equal to 85°. End arms 48 are biased into this angular position with respect to bottom wall 40, such that, when end arms 48 are urged away from one another the biasing force urges their return to the position shown in FIG. 8.

Clamping flanges 50 are rigidly connected to the top edges 52 of end arms 48. Clamping flanges 50 extend orthogonally from end arms 48 a distance indicated by "F" which preferably equals 0.125 inches.

The distance "G" as shown in FIG. 8 substantially equals the distance "C" shown in FIG. 6 plus the thickness of the integrated circuit chip with which the subject heat dissipator will be used. Additionally, the width of heat conducting clamp 12 as indicated by distance "H" in FIG. 1 substantially equals the width of end walls 34 of radiator chimney 10 as indicated by distance "B" in FIG. 5. Thus, when heat conducting clamp 12 and radiator chimney 10 are mounted about chip 14 as explained below, clamping flanges 50 will securely engage end walls 34 of top radiator chimney 10.

Returning to FIG. 1, the subject heat dissipator is mounted on IC chip 14 by first placing radiator chimney 10 on top surface 16 of chip 14. More particularly, radiator chimney 10 is placed on top surface 16 of chip 14 such that grounding plate 24 extends into aperture 36 in the bottom wall 30 of radiator chimney 10. This mounting assures proper positioning of radiator chimney 10 on chip 14 and prohibits shifting of the assembled unit thereby preventing possible short circuits.

After top radiator chimney 10 is properly positioned on chip 14, heat conducting clamp 12 is mounted against bottom surface 18 of chip 14 and secured to radiator chimney 10. More specifically, end arms 48 of heat conducting clamp 12 are biased away from one another about their bottom edges 44 so that the distance between clamping flanges 50 exceeds the lengths of chip 14 and radiator chimney 10 as indicated by "A". Heat conducting clamp 12 is then advanced between the rows of pins 28 until the upper surface 46 of the bottom contact plate 40 on heat conducting clamp 12 abuts the bottom surface 18 of chip 14. At this point the biasing forces exerted on end arms 48 of heat conducting clamp 12 may be released thereby allowing end walls 48 to be urged toward one another. Clamping flanges 50 then will be securely engaged between the side walls 32 of radiator chimney 10 and against the top edges 35 of end walls 34 thereof. This secure clamping engagement achieves two functions. First, it maintains the top and bottom contact plates 30 and 40 of radiator chimney 10 and heat conducting clamp 12 respectively against the top and bottom surfaces 16 and 18 of chip 14. This secure engagement with chip 14 assures efficient radiation of heat therefrom. Second, the secure clamping of flanges 50 between side walls 32 of radiator chimney 10 combined with the secure positioning of grounding plate 24 in aperture 36, ensures that heat conducting clamp 12 will not accidentally shift into shorting contact with pins 28. It is important to emphasize that the mounting of heat conducting clamp 12 only requires the simple urging of flanges 50 away from one another. The size and configuration of heat conducting clamp 12 enables the mounting to be accomplished quickly and easily.

Figure 3:
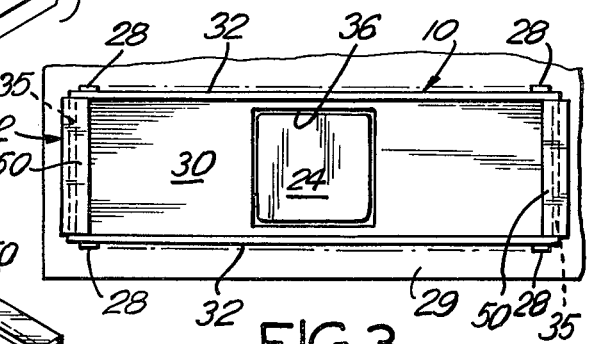
FIG. 3 is a top view of the subject heat dissipator mounted on an integrated circuit chip, which in turn is mounted on a printed circuit board.
Figure 2:
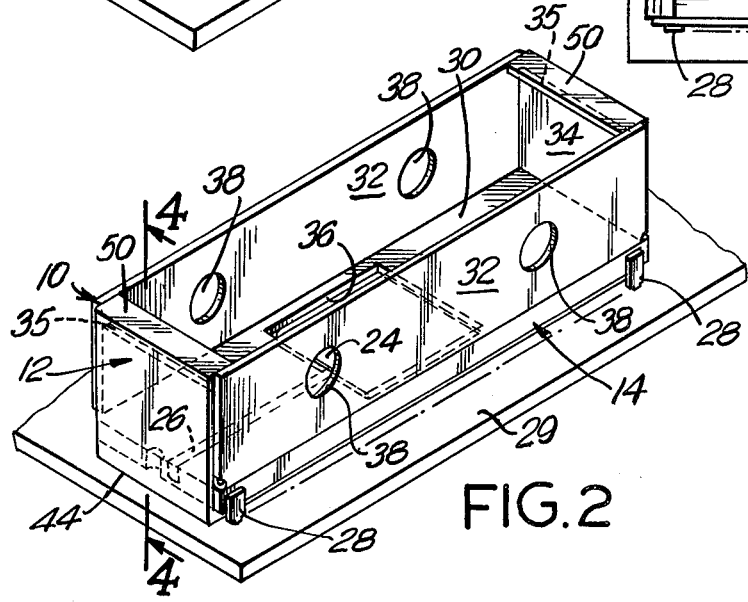
FIG. 2 is a perspective view of the subject heat dissipator mounted on an integrated circuit chip which in turn is mounted on a printed circuit board.

Once the subject heat dissipator is properly positioned upon chip 14, as shown in FIGS. 2 through 4, and as explained above, heat generated by chip 14 will be conducted through the subject heat dissipator and radiated into the surrounding air. More particularly, heat generated through the top surface 16 of chip 14 will be conducted to top contact plate 30 of radiator chimney 10 and subsequently conducted therefrom to opposed side and end walls thereof 32 and 34 respectively. Similarly, heat will be conducted from bottom surface 18 of chip 14 into bottom contact plate 40 of heat conducting clamp 12. That heat subsequently will be conducted to radiator chimney 10 through end arms 48 of heat conducting clamp 12. As shown most clearly in FIG. 4, end arms 48 of heat conducting clamp 12 and end walls 34 of radiator chimney 10 are in face to face contact. This contacting relationship provides for optimum heat conduction between the respective end walls 34 and arms 48. As a result, heat from both the bottom and top surfaces 16 and 18 of chip 14 will be efficiently conducted away from chip 14 to radiator chimney 10.

Heat is further radiated from radiator chimney 10 into the surrounding air due to the chimney effect that is inherent in the subject structure. Specifically, air is able to flow around the outside of radiator chimney 10, and also into and upwardly out of radiator chimney 10 through airflow apertures 38 in side walls 32 thereof. Thus, the subject heat dissipator provides for maximum conduction of heat from both top and bottom surfaces 16 and 18 of chip 14 to radiator chimney 10, and further provides for an optimum flow of air around, into and upwardly through radiator chimney 10 to facilitate radiation of heat into the air. As mentioned above, the airflow may be further facilitated by mechanical means used in conjunction with the device in which the subject heat dissipator is utilized.

The heat dissipator of the subject invention can easily be removed from chip 14 and mounted on another chip. Specifically, to remove the subject heat dissipator from chip 14 a force is exerted on flanges 50 to urge side arms 48 of heat conducting clamp 12 away from one another sufficiently so that the distance between flanges 50 exceeds the length "A" of radiator chimney 10. Heat conducting clamp 12 then is urged downwardly until flanges 50 clear the side walls 22 of chip 14. As mentioned above, the size and configuration of the subject heat dissipator makes the urging of flanges 50 away from one another a simple, manual task that can be accomplished quickly. End arms 48 of heat conducting clamp 12 then will be permitted to return to their initial alignment with respect to bottom wall 40 as indicated by angle "E", shown in FIG. 8. Subsequently, radiator chimney 10 may simply be removed from top surface 16 of chip 14. The subject heat dissipator may then be reassembled onto a new chip in the manner explained above In summary, an improved heat dissipator is provided for use with an integrated circuit chip such as a microcomputer or microprocessor. The heat dissipator includes a substantially box-shaped radiator chimney for mounting on the top surface of the chip. The radiator chimney includes a top contact plate having an aperture which engages the raised grounding plate on the chip. This engagement ensures proper positioning of the subject heat dissipator and inhibits shifting. The radiator chimney further includes opposed pairs of upstanding end and side walls. The opposed side walls include a plurality of airflow apertures to facilitate the movement of air into and upwardly through the subject heat dissipator thereby improving its efficiency. A heat conducting clamp mounts against the bottom surface of the chip and securely engages the opposed end walls of the radiator chimney. This arrangement ensures efficient conduction of heat away from both top and bottom surfaces of the chip to the radiator chimney and further ensures efficient radiation of the heat to the surrounding air without extending beyond the plan dimensions of the chip. The heat dissipator can be easily mounted on or removed from the chip by biasing the end arms of the heat conducting clamp away from one another to allow slidable movement of the heat conducting clamp with respect to the radiator chimney and the chip.

While the subject invention has been described with reference to a preferred embodiment, it is apparent that further changes and modifications can be made therein by one skilled in the art without varying from the scope and spirit of the invention as defined by the appended claims.

What is claimed is:

1. A heat dissipator for use with an integrated circuit chip, said chip being a substantially rectangular structure having opposed top and bottom surfaces, said heat dissipator comprising:

a radiator chimney including a substantially rectangular top contact plate having opposed side and end edges and opposed pairs of substantially rectangular upstanding side and end walls extending from and connected to said side and end edges of said top contact plate respectively, said side and end walls of said radiator chimney defining a substantially rectangular tubular chimney structure; and a heat conducting clamp including a substantially rectangular bottom contact plate having opposed side and end edges, a pair of substantially upstanding end arms extending from and connected to said opposed end edges of said bottom contact plate, and a pair of clamping flanges connected respectively to said end arms, said clamping flanges extending toward one another and being spaced from said bottom contact plate a sufficient distance to enable said clamping flanges to engage said end wall when said radiator chimney and said heat conducting clamp are disposed on opposite sides of said chip, whereby when said top and bottom contact plates are placed into face-to-face contacting relationship with said top and bottom surfaces of said chip, said end arms and said clamping flanges clamp into face to face engagement with said end walls thereby clamping said radiator chimney and said heat conducting clamp onto said chip.

2. A heat dissipator as in claim 1 for use with an integrated circuit chip having a raised grounding plate on the top surface thereof, said contact plate of said radiator chimney having an aperture therein for securely engaging the raised grounding plate on the top surface of the chip, whereby the engagement of said raised grounding plate by said aperture positions said radiator chimney on said chip and inhibits relative movement therebetween.

3. A heat dissipator as in claim 1 wherein said end walls of said radiator chimney each include top edges opposite the edges thereof adjacent said top contact plate, said clamping flanges engaging the top edges of said radiator chimney end walls to clamp said radiator chimney and said heat conducting clamp onto said chip.

4. A heat dissipator as in claim 1 wherein the plan dimensions of said top contact plate are substantially equal to the plan dimensions of said chip.

5. A heat dissipator as in claim 4 wherein said radiator chimney side walls extend upwardly from the top contact plate side edges for substantially the entire length thereof and wherein said radiator chimney end walls extend upwardly from the top contact plate end edges and are disposed intermediate the radiator chimney side walls.

6. A heat dissipator as in claim 5 wherein the height of said radiator chimney end walls measured from said top contact plate is less than the height of said radiator chimney side walls measured from said top contact plate.

7. A heat dissipator as in claim 6 wherein said heat conducting clamp end arms are substantially rectangular and have a height measured from said bottom contact plate substantially equal to the height of said radiator chimney end walls plus the distance between the top and bottom surfaces of said chip, and wherein a pair of clamping flanges extend toward one another from the edges of said end arms opposite said bottom contact plate, such that said clamping flanges are clamped into engagement with the radiator chimney end wall top edges.

8. A heat dissipator as in claim 7 wherein said clamping flanges are substantially rectangular and wherein the length of said rectangular flanges measured along their respective connections to said end arms substantially equals the distance between said radiator chimney side walls such that said side and end walls of said radiator chimney engage said clamping flanges of said heat conducting clamp to inhibit slidable movement therebetween.

9. A heat dissipator as in claim 1 wherein said end arms extend from said bottom contact plate at angles less than 90° and are angled toward one another.

10. A heat dissipator as in claim 9 wherein each said end arm is angularly separated from said bottom contact plate by an angle of approximately 85°.

11. A heat dissipator as in claim 1 wherein said radiator chimney includes a plurality of air flow apertures in each said side wall thereof for causing a heat dissipating upflow of air through said radiator chimney.

12. A heat dissipator as in claim 11 wherein each said radiator chimney side wall includes two circular airflow apertures.

13. A heat dissipator for use with an integrated circuit chip, said chip being a substantially rectangular structure having opposed top and bottom surfaces, said heat dissipator comprising:

a radiator chimney including a substantially rectangular top contact plate having opposed side and end edges and opposed pairs of substantially rectangular upstanding side and end walls extending from and connected to said side and end edges of said top contact plate respectively, said side and end walls each having bottom edges adjacent said top contact plate and opposed top edges, the said side walls being greater than the distance between said top and bottom edges of said end walls, said side and end walls of said radiator chimney defining a substantially rectangular tubular chimney structure; and a heat conducting clamp including a substantially rectangular bottom contact plate having opposed side and end edges, a pair of substantially rectangular end arms extending from and connected to said opposed end edges and a pair of clamping flanges connected respectively to said end arms, the distance between said opposed end edges of said bottom contact plate being substantially equal to the distance between opposed end edges of said top contact plate, the distance between said clamping flanges and said bottom contact plate being substantially equal to the distance between said top and bottom edges of said end walls plus the distance between the top and bottom surfaces of the chip, whereby when said top and bottom contact plates are placed in face-to-face contacting relationship with said top and bottom surfaces of said chip, said end arms clamp into face-to-face engagement with said end walls and said clamping flanges clamp into engagement with said end wall top edges and said side walls thereby clamping said radiator chimney and said heat conducting clamp onto said chip.

* * * * *